United States Patent
Hsu

(10) Patent No.: US 9,245,735 B2
(45) Date of Patent: Jan. 26, 2016

(54) UPPER ELECTRODE DEVICE

(71) Applicant: EverDisplay Optronics (Shanghai) Limited, Shanghai (CN)

(72) Inventor: Hsiuchi Hsu, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 150 days.

(21) Appl. No.: 14/155,089

(22) Filed: Jan. 14, 2014

(65) Prior Publication Data
US 2014/0360601 A1 Dec. 11, 2014

(30) Foreign Application Priority Data

Jun. 8, 2013 (CN) .......................... 2013 1 0229521

(51) Int. Cl.
*H01L 21/00* (2006.01)
(52) U.S. Cl.
CPC .......... *H01L 21/00* (2013.01); *Y10T 137/85938* (2015.04)
(58) Field of Classification Search
CPC ................................... B01D 53/226
USPC ............... 137/561 A; 118/715; 239/548, 552, 239/553.3, 553.5, 556, 590, 590.3, 590.5
See application file for complete search history.

(56) References Cited

U.S. PATENT DOCUMENTS

| | | | | |
|---|---|---|---|---|
| 5,595,606 A * | 1/1997 | Fujikawa et al. | ............. | 118/725 |
| 6,599,367 B1 * | 7/2003 | Nakatsuka | ............. | 118/715 |
| 7,442,274 B2 * | 10/2008 | Maruyama | ............. | 156/345.5 |
| 2003/0234079 A1 * | 12/2003 | Jiang et al. | ............. | 156/345.33 |
| 2004/0250768 A1 * | 12/2004 | Kikuchi et al. | ............. | 118/715 |
| 2005/0011447 A1 * | 1/2005 | Fink | ............. | 118/715 |
| 2006/0288934 A1 * | 12/2006 | Takahashi et al. | ............. | 118/715 |
| 2008/0196666 A1 * | 8/2008 | Toshima | ............. | 118/723 E |
| 2012/0208265 A1 * | 8/2012 | Partsch et al. | ............. | 435/289.1 |

FOREIGN PATENT DOCUMENTS

| CN | 201148466 Y | 11/2008 |
|---|---|---|
| CN | 202558927 U | 11/2012 |
| WO | 2005096345 A1 | 10/2005 |

* cited by examiner

*Primary Examiner* — Craig Schneider
*Assistant Examiner* — Daniel P Donegan
(74) *Attorney, Agent, or Firm* — Andrew F. Young, Esq.; Lackenbach Siegel, LLP

(57) ABSTRACT

An upper electrode device applied to the film coating process has a splitter chamber and at least three gas diversion plates; a gas inlet is set on the splitter chamber; the at least three gas diversion plates were fixed on the inside walls of the splitter chamber and used for diverting and outputting the gas introduced into the splitter chamber through the gas inlet. By using the upper electrode device provided by the present disclosure can uniformize the gas used for coating in the film coating process, especially uniformize the gas in the perimeter area and the center area. Consequently, the uniformity of the thickness of the whole film coated is improved.

8 Claims, 4 Drawing Sheets

UPPER ELECTRODE DEVICE

CROSS-REFERENCE TO RELATED APPLICATIONS

The present application claims priority to and the benefit of Chinese Patent Application No. CN201310229521.X, filed on Jun. 8, 2013, the entire content of which is incorporated herein by reference.

BACKGROUND OF THE INVENTION

1. Field of the Invention

The present disclosure relates to a device in the technology field of film coating, more specifically, to an upper electrode device.

2. Description of the Related Art

In the related art of film coating, the upper electrode device in the gas diffusion system on the process machine generally comprises the gas diversion plate which is a three-layers structure. FIG. 1A shows a side view of the upper electrode device in the related art; FIG. 1B shows a vertical view of the upper electrode device in the related art. As shown in FIG. 1A, the upper electrode device comprises three gas diversion plates. From the top to the bottom, there is First Gas Diversion Plate 1', Second Gas Diversion Plate 2' and Third Gas Diversion Plate 3' in sequence, and hole(s) with the same size were formed on the surface of each gas diversion plate. As shown in FIGS. 1A and 1B, the holes were distributed in forms of matrix on the surface of each gas diversion plate. Holes 41' on the surface of First Gas Diversion Plate 1' was vertically staggered from Holes 42' on the surface of Second Gas Diversion Plate 2'. Likewise, Holes 42' on the surface of Second Gas Diversion Plate 2' was vertically staggered from Holes 43' formed on the surface of Third Gas Diversion Plate 3'. To some extent, the upper electrode device can divert the gas and makes the film coated more uniform, but in the actual process of coating film, effect of the gas diversion is not ideal. When the gas was diverted into the lowest layer during the process of film coating, the gas near the centre part is sufficient but the gas near the edge or the corners is insufficient, which causes that the thickness of the film coated is not uniform, i.e., the thickness in the center area of the film coated is thick and the thickness in the edge of the film coated is thin. Consequently, the performance of the device is low.

A related art has provided a sputtering coating equipment for improving the uniformity of the film, which comprises a square air inlet pipe and a round air inlet pipe. Twenty-two gas spray nozzles are installed on the surface of the square air inlet pipe, which faces to a target, and three hanging pieces are installed above the square air inlet pipe and used for fixing the whole air inlet device. The sputtering coating equipment is used for solving the problem that the thickness of the film coated by the device is uneven because of an uneven air supply device in the related art. However, the multiple gas spray nozzles cause a complicated structure of the device, and it is not easy to control the consistency between the gas spray nozzles. Hence, it is not easy to be applied in the actual manufacturing processes.

Another related art provides a coating device for a dispersion plate which is used for the dispersion of gas. The coating device comprises a hollow type shell body provided with a coating chamber, an electrode unit with a plurality of electrode plates which are separated arranged inside the coating chamber, a gas delivery pipe which delivers the coating gas into the coating chamber of the shell body, a suction unit of a pump which is communicated with the coating chamber, and a dispersion plate with a plurality of relief holes which are separated and close to the bottom side of the electrode plate. The relief holes are arranged on the most area of the bottom side of the electrode plate. With the relief holes, the coating gas can be uniformly distributed on the coating chamber, so the coating yield is increased and the overall coating efficiency is improved. Although the film coating device disclosed in this patent has the effect to disperse the gas, it did not relate to promoting the uniformity of the film at the area of the edges and the corners after the gas was dispersed.

Hence, there is no effective solution for solving the problem in the related arts.

SUMMARY OF THE INVENTION

An embodiment of the present disclosure is directed toward an upper electrode device capable of dispersing the gas for coating and uniformizing the film coated.

The upper electrode device comprises: a splitter chamber provided with a gas inlet; and at least three gas diversion plates fixed on the inside walls of the splitter chamber for diverting and outputting the gas introduced into the splitter chamber through the gas inlet.

According to one embodiment of the present disclosure, a plurality of blowholes are set on each gas diversion plate, and the bore diameter of the blowholes on the same gas diversion plate are the same.

According to one embodiment of the present disclosure, the gas inlet is set on the top of the splitter chamber;

the gas diversion plate is set below the gas inlet, and each gas diversion plate is parallel to the top surface of the splitter chamber.

According to one embodiment of the present disclosure, two gas diversion plates adjacent to each other and the inside walls between the two gas diversion plates together constitute a unit chamber;

the gas exchanged from a unit chamber to an adjacent unit chamber through the blowholes.

According to one embodiment of the present disclosure, the bore diameters of the blowholes on each gas diversion plate are larger than the bore diameters of the blowholes on the gas diversion plates below.

According to one embodiment of the present disclosure, the blowholes set on the gas diversion plates adjacent to each other are vertically, refer to the direction of the surface of the gas diversion plate, staggered.

According to one embodiment of the present disclosure, the at least three gas diversion plates comprise a top gas diversion plate, a bottom gas diversion plate and at least one middle gas diversion plate;

the gas introduced into the splitter chamber through the gas inlet diverted through the top gas diversion plate, the middle gas diversion plate and the bottom gas diversion plate in sequence; the gas gets out of the splitter chamber through the bottom gas diversion plate.

According to one embodiment of the present disclosure, a plurality of blowholes on the top gas diversion plate is distributed on the top gas diversion plate;

a plurality of blowholes on each middle gas diversion plate is distributed on the middle gas diversion plate;

the density of the blowholes on the bottom gas diversion plate gradually increases in direction from the geometrical center of the bottom gas diversion plate to its edge.

According to one embodiment of the present disclosure, the bottom gas diversion plate comprises a center area and a perimeter area; the density of the blowholes in the perimeter area is 1.1 to 1.2 times as the density of the blowholes in the center area.

According to one embodiment of the present disclosure, the perimeter area is the area within a distance of lower than 50 mm to the edge of the bottom gas diversion plate.

According to one embodiment of the present disclosure, the bore diameter of the blowholes on the top gas diversion plate ranges from 5 mm to 10 mm.

According to one embodiment of the present disclosure, the bore diameter of the blowholes on the bottom gas diversion plate ranges from 0.2 mm to 0.6 mm.

According to one embodiment of the present disclosure, the blowholes are extending through the upper surface and lower surface of each gas diversion plate.

BRIEF DESCRIPTIONS OF THE DRAWINGS

The accompanying drawings, together with the specification, illustrate exemplary embodiments of the present disclosure, and, together with the description, serve to explain the principles of the present disclosure.

DETAILED DESCRIPTIONS

Figure 1A:
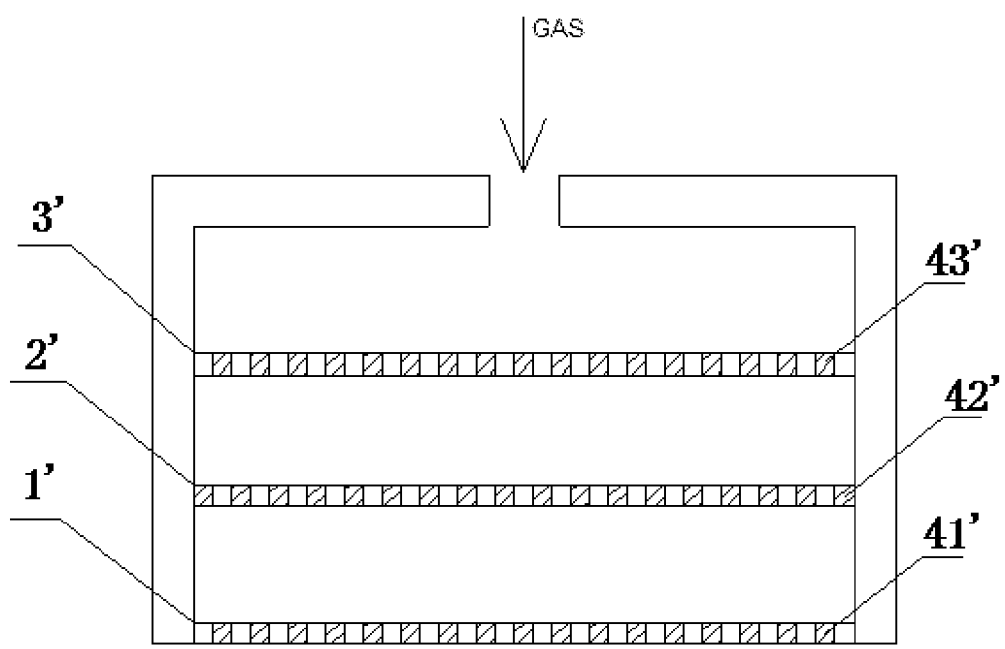
FIG. 1A shows a side view of the upper electrode device in the related art.
Figure 1B:
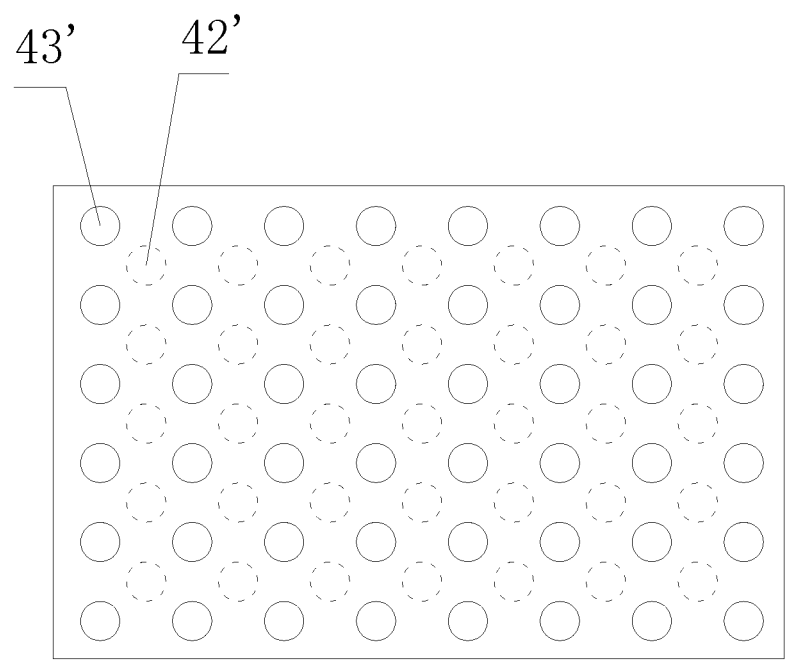
FIG. 1B shows a vertical view of the upper electrode device in the related art.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

The upper electrode device in the present disclosure will be further illustrated based on the embodiments and the figures.

In the present disclosure, the upper electrode device comprises a splitter chamber and at least three gas diversion plates. The three gas diversion plates are set inside the splitter chamber and divide the internal space of the splitter chamber into at least three parts vertically. The spaces adjacent to each other are separated by one of the gas diversion plates.

A gas inlet is set on the top of the splitter chamber, through which the gas for coating can pass into the splitter chamber. The bottom of the splitter chamber is provided with a gas diversion plate for outputting the gas. The other parts of the splitter chamber are sealed with no opening. In another word, when the coating gas is led in through the gas inlet on the top of the splitter chamber, it can outflow only from the bottom of the splitter chamber.

The number of the gas diversion plates internally set in the splitter chamber usually can be three, four, five, six and so on.

Figure 2:
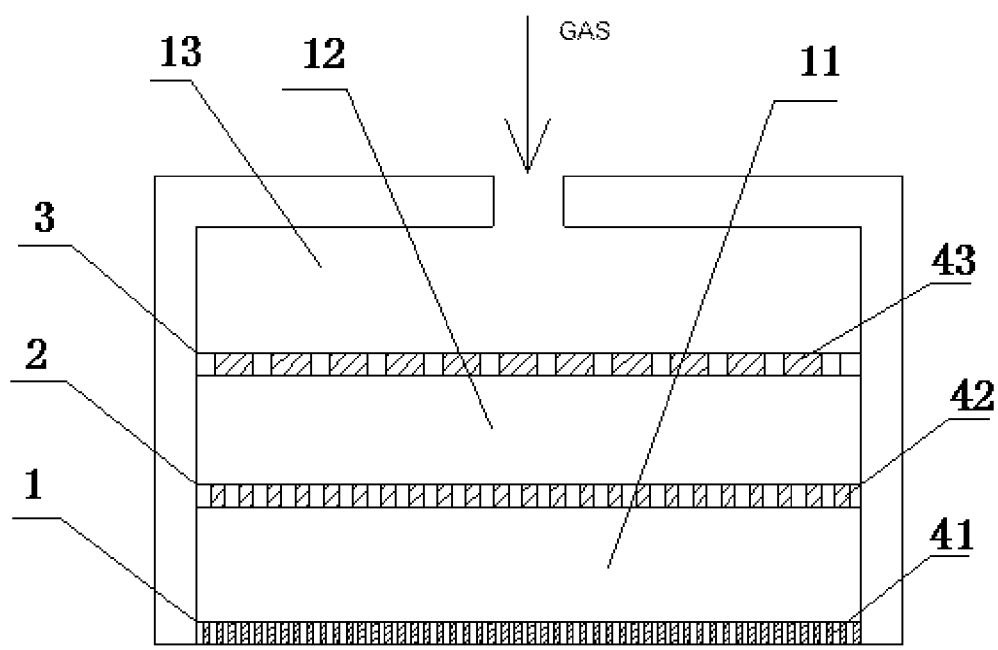
FIG. 2 shows a side view of the upper electrode device in the present disclosure.

FIG. 2 shows a side view of the upper electrode device in the present disclosure. As shown in FIG. 2, in this embodiment, the number of the gas diversion plates is three, and the three gas diversion plates are set inside the splitter chamber and parallel to each other. From the bottom to the top in sequence, there is a Bottom Gas Diversion Plate 1, a Middle Gas Diversion Plate 2 and a Top Gas Diversion Plate 3. Bottom Gas Diversion Plate 1 is set in the bottom of the splitter chamber. The flat shape of Bottom Gas Diversion Plate 1 is the same as the cross section of the splitter chamber. The side of Bottom Gas Diversion Plate 1 was sealed up and fixed on the inside walls of the bottom of the splitter chamber. The Middle Gas Diversion Plate 2 is set above Bottom Gas Diversion Plate 1. Similarly, the flat shape of Middle Gas Diversion Plate 2 is the same as the cross section of the splitter chamber. Meanwhile, the side of Middle Gas Diversion Plate 2 was sealed up and fixed on the inside walls of the splitter chamber. Top Gas Diversion Plate 3 is set above Middle Gas Diversion Plate 2. Similarly, the flat shape of Top Gas Diversion Plate 3 is the same as the cross section of the splitter chamber. Meanwhile, the side of Top Gas Diversion Plate 3 was sealed up and fixed on the inside walls of the splitter chamber. After setting Bottom Gas Diversion Plate 1, Middle Gas Diversion Plate 2 and Top Gas Diversion Plate 3, the internal space of the splitter chamber is divided into three chambers. From the bottom to the top in sequence, there is a First Unit Chamber 11, a Second Unit Chamber 12 and a Top Unit Chamber 13. First Unit Chamber 11 is constituted by Bottom Gas Diversion Plate 1, Middle Gas Diversion Plate 2 and the inside walls of the splitter chamber between Bottom Gas Diversion Plate 1 and Middle Gas Diversion Plate 2. Second Unit Chamber 12 is constituted by Middle Gas Diversion Plate 2, Top Gas Diversion Plate 3 and the inside walls of the splitter chamber between Middle Gas Diversion Plate 2 and Top Gas Diversion Plate 3. Top Unit Chamber 13 is constituted by Top Gas Diversion Plate 3, the top of the splitter chamber and the inside walls of the splitter chamber between Top Gas Diversion Plate 3 and the top of the splitter chamber.

As shown in FIG. 2, blowholes are set on the surface of Bottom Gas Diversion Plate 1, Middle Gas Diversion Plate 2 and Top Gas Diversion Plate 3. The blowholes are the holes extending through the upper surface and lower surface of each gas diversion plate. These blowholes are set for connecting the unit chambers in the different parts of the splitter chamber. First Unit Chamber 11 is connected to the outside area of the splitter chamber through Blowholes 41 set on Bottom Gas Diversion Plate 1. Second Unit Chamber 12 is connected to First Unit Chamber 11 through Blowholes 42 set on Middle Gas Diversion Plate 2. Top Unit Chamber 13 is connected to Second Unit Chamber 12 through Blowholes 43 set on Top Gas Diversion Plate 3. Hence, after that the gas are introduced into the splitter chamber through the gas inlet and pass through the top unit chamber, the second unit chamber and the first unit chamber in sequence, the gas can get out of the splitter chamber through Blowholes 41 on Bottom Gas Diversion Plate 1.

Figure 3:
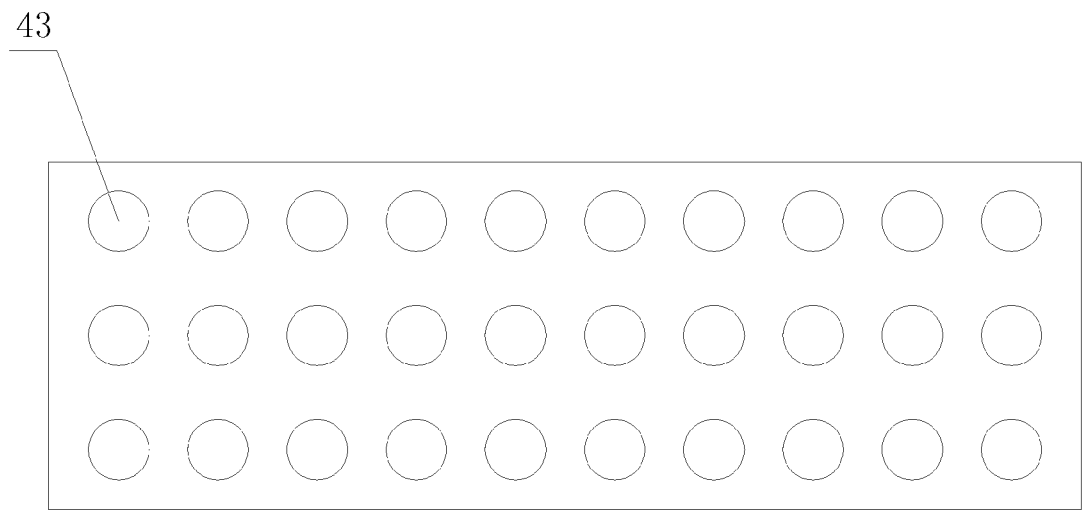
FIG. 3 shows a vertical view of the top gas diversion plate in the upper electrode device of the present disclosure.
Figure 4:
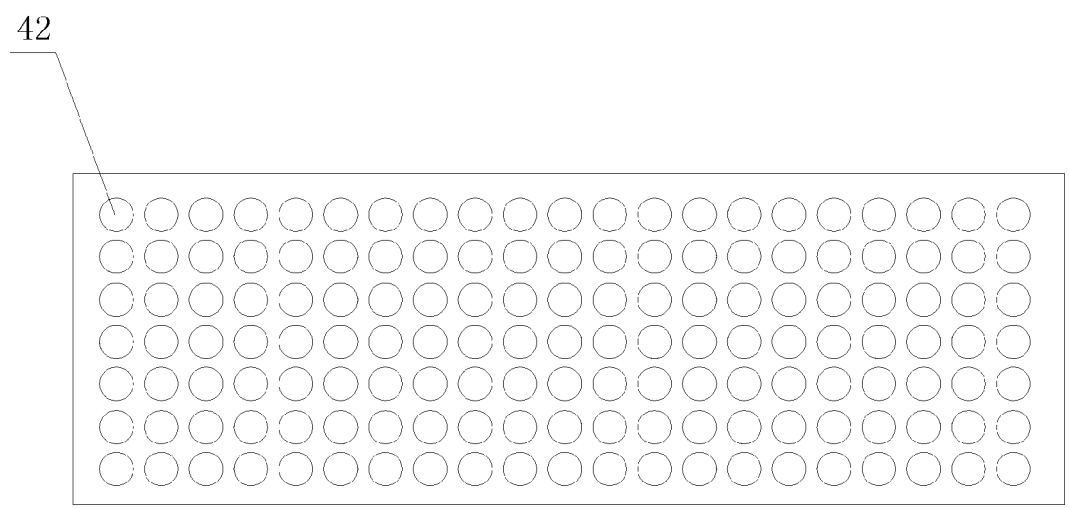
FIG. 4 shows a vertical view of the middle gas diversion plate in the upper electrode device of the present disclosure.
Figure 5:
FIG. 5 shows a vertical view of the bottom gas diversion plate in the upper electrode device of the present disclosure.

FIG. 3 shows a vertical view of the top gas diversion plate in the upper electrode device of the present disclosure; FIG. 4 shows a vertical view of the middle gas diversion plate in the upper electrode device of the present disclosure; FIG. 5 shows a vertical view of the bottom gas diversion plate in the upper electrode device of the present disclosure. As shown in FIGS. 3 to 4, Blowholes 42 set on Middle Gas Diversion Plate 2 are distributed in matrix on the surface of Middle Gas Diversion Plate 2. As shown in FIG. 3, Blowholes 43 set on Top Gas Diversion Plate 3 are distributed in matrix on the surface of Top Gas Diversion Plate 3. This means that the blowholes on Middle Gas Diversion Plate 2 and on Top Gas Diversion Plate 3 are distributed uniformly. However, the bore diameters of the blowholes on the three gas diversion plates are different. Specifically, the bore diameters of the blowholes set on Bottom Gas Diversion Plate 1 are smaller than the bore diameters of the blowholes set on Middle Gas Diversion Plate 2; the bore diameters of the blowholes set on Middle Gas Diversion Plate 2 are smaller than the bore diameters of the blowholes set on Top Gas Diversion Plate 3. The blowholes on the gas diversion plates adjacent to each other are vertically staggered. In another word, the geometrical centers of the blowholes on the gas diversion plates adjacent to each other are not coincided in vertical direction. The geometrical centers of Blowholes 41 set on Bottom Gas Diversion Plate 1 are not coincided with the geometrical center of Blowholes 42 set on Middle Gas Diversion Plate 2. The geometrical centers of Blowholes 42 set on Middle Gas Diversion Plate 2 are not coincided with the geometrical center of Blowholes 43 set on Top Gas Diversion Plate 3 in vertical direction.

Moreover, the density of Blowholes 43 set on Top Gas Diversion Plate 3 can be either the same as or the different from the density of Blowholes 42 set on Middle Gas Diversion Plate 2, as long as Blowholes 43 set on Top Gas Diversion Plate 3 do not align with Blowholes 42 set on Middle Gas Diversion Plate 2 directly. As shown in FIG. 5, the distribution of Blowholes 41 set on Bottom Gas Diversion Plate 1 is different from the distribution of the blowholes set on Middle Gas Diversion Plate 2 or the on Top Gas Diversion Plate 3. The blowholes set on Middle Gas Diversion Plate 2 and on Top Gas Diversion Plate 3 are distributed uniformly, i.e., the density of Blowholes 42 set on Middle Gas Diversion Plate 2 in any area on the gas diversion plate is the same; the density of Blowholes 43 set on Top Gas Diversion Plate 3 in any area on the gas diversion plate is the same. However, the density of Blowholes 41 set on Bottom Gas Diversion Plate 1 is gradually increased in the direction from the geometrical center of the gas diversion plate to the edge of it. In particular, the blowholes can be set as the follows: the density of Blowholes 41 in the perimeter area of Bottom Gas Diversion Plate 1, which are within the distance of 50 mm from the edge of the bottom gas diversion plate 1, is 1.1 to 1.2 times of the density of the blowholes in the center area of Bottom Gas Diversion Plate 1, such as 1.1 times, 1.11 times, 1.12 times, 1.15 times, 1.2 times.

According to the difference of the positions where each of the gas diversion plate is located in the upper electrode device, from the top to the bottom, the bore diameters of the blowholes are decreased in sequence. In particular, the bore diameters of the blowholes 43 set on the top gas diversion plate 3 range from 5 mm to 10 mm, and the bore diameters of Blowholes 41 set on Bottom Gas Diversion Plate 1 range from 0.2 mm to 0.6 mm, such as 0.2 mm, 0.3 mm, 0.4 mm, 0.5 mm, 0.6 mm. The bore diameters of Blowholes 42 set on Middle Gas Diversion Plate 2 is between the bore diameters of Blowholes 43 set on Top Gas Diversion Plate 3 and the bore diameters of Blowholes 41 set on Bottom Gas Diversion Plate 1.

The operation principle of the upper electrode device in the embodiment will be further illustrated based on the figures.

As shown in FIG. 2, when the gas for coating passes into the splitter chamber through the gas inlet set on the top of the upper electrode device, the gas gradually fulfills Top Unit Chamber 13. When the gas is introduced into the splitter chamber continuously, the gas in Top Unit Chamber 13 will be squeezed to Second Unit Chamber 12 through Blowholes 43 set on Top Gas Diversion Plate 3. Likewise, the gas gradually fulfills Second Unit Chamber 12, than the gas will be squeezed to First Unit Chamber 11 through Blowholes 42 set on Middle Gas Diversion Plate 2. The gas gradually fulfills First Unit Chamber 11 and passes out of the upper electrode device through Blowholes 41 set on Bottom Gas Diversion Plate 1 for coating film on the surface of the object below.

During the process, as the bore diameters of the blowholes set on the gas diversion plates where the gas passes through are gradually decreased, the distribution of the gas will be more uniform when the gas has passed through a gas diversion plate into another unit chamber. After the diversion for several times, the uniformity of the distribution of the gas is greatly promoted. Moreover, the density of Blowholes 41 in the perimeter area of Bottom Gas Diversion Plate 1 is 1.1 to 1.2 times of the density of the blowholes 41 in the center area of Bottom Gas Diversion Plate 1 which is the last gas diversion plate that the gas passes through, which makes the gas not easily be obstructed in the perimeter area of Bottom Gas Diversion Plate 1 when passing through. Consequently, the surface of the object below can be coated with the smooth flow of the gas and the thickness of the film coated can be more uniform.

In conclusion, the present disclosure starts from the problem occurs in the usage of the upper electrode device in film coating system. Based on the problem that the gas is easily obstructed in the perimeter area of the last gas diversion plate when passing through and the problem that the distribution of the gas for coating is not uniform causing the uniform thickness of the film, the present disclosure provides the technical solution of setting at least three gas diversion plates in the upper electrode device. Moreover, from the top to the bottom, a plurality of blowholes are set on each gas diversion plate, and the bore diameter of the blowholes on the gas diversion plate below is smaller than that of the blowholes on the gas diversion plate above, which makes the gas more uniform when passing through the gas diversion plate. The density of the blowholes in the perimeter area of the bottom gas diversion plate is larger than the density of the blowholes in the center area of the bottom gas diversion plate, which makes the distribution of the gas more uniform. Consequently, the problem in the related art that the distribution of the gas is not uniform can be solved.

Hence, the upper electrode device in the present disclosure can effectively solve the problem of the uniformity of the distribution of the gas for coating, especially the problem of the uniformity of the distribution of the gas in the edge and corners of the gas diversion plate.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An upper electrode device, comprising:
   a splitter chamber provided with a gas inlet; and
   at least three gas diversion plates fixed on inside walls of the splitter chamber for diverting and outputting the gas introduced into the splitter chamber through the gas inlet;
   wherein a plurality of blowholes is set on each gas diversion plate, and the bore diameter of the blowholes on the same gas diversion plate are the same;
   wherein the at least three gas diversion plates comprise a top gas diversion plate, a bottom gas diversion plate and at least one middle gas diversion plate;
   the gas introduced into the splitter chamber through the gas inlet diverted through the top gas diversion plate, the middle gas diversion plate and the bottom gas diversion plate in sequence; the gas gets out of the splitter chamber through the bottom gas diversion plate;
   wherein a plurality of blowholes on the top gas diversion plate is distributed on the top gas diversion plate;
   a plurality of blowholes on each middle gas diversion plate are distributed on the middle gas diversion plate;
   the density of the blowholes on the bottom gas diversion plate gradually increases in direction from the geometrical center of the bottom gas diversion plate to its edge;
   wherein the bottom gas diversion plate comprises a center area and a perimeter area: the density of the blowholes in the perimeter area is 1.1 to 1.2 times the density of the blowholes in the center area;
   wherein the perimeter area is the area within a distance of lower than 50 mm to the edge of the bottom gas diversion plate.

2. The upper electrode device as claimed in claim 1, wherein the gas inlet is set on the top of the splitter chamber;
   the gas diversion plate is set below the gas inlet, and each gas diversion plate is parallel to the top surface of the splitter chamber.

3. The upper electrode device as claimed in claim 2, wherein two gas diversion plates adjacent to each other and the inside walls between the two gas diversion plates together constitute a unit chamber;
   the gas exchanged from a unit chamber to an adjacent unit chamber through the blowholes.

4. The upper electrode device as claimed in claim 2, wherein the bore diameters of the blowholes on each gas diversion plate are larger than the bore diameters of the blowholes on the gas diversion plates below.

5. The upper electrode device as claimed in claim 1, wherein the blowholes set on the gas diversion plates adjacent to each other are vertically, refer to the direction of the surface of the gas diversion plate, staggered.

6. The upper electrode device as claimed in claim 1, wherein the bore diameter of the blowholes on the top gas diversion plate ranges from 5 mm to 10 mm.

7. The upper electrode device as claimed in claim 1, wherein the bore diameter of the blowholes on the bottom gas diversion plate ranges from 0.2 mm to 0.6 mm.

8. The upper electrode device as claimed in claim 1, wherein the blowholes are extending through the upper surface and lower surface of each gas diversion plate.

* * * * *